United States Patent [19]

Armstrong et al.

[11] 4,177,455

[45] Dec. 4, 1979

[54] ELECTRICALLY CONFIGURABLE HIGH-LOW DECODER

[75] Inventors: Rolfe D. Armstrong, Escondido; George B. Gillow, Bonita, both of Calif.

[73] Assignee: NCR Corporation, Dayton, Ohio

[21] Appl. No.: 867,853

[22] Filed: Jan. 9, 1978

[51] Int. Cl.² .......................................... H03K 13/243
[52] U.S. Cl. ............................................... 340/347 DD
[58] Field of Search ................ 340/347 DD; 364/716, 364/900; 307/207

[56] References Cited

U.S. PATENT DOCUMENTS

| | | | |
|---|---|---|---|
| 3,034,719 | 5/1962 | Anfenger | 235/310 |
| 3,421,151 | 1/1969 | Wong | 364/900 |
| 3,594,730 | 7/1971 | Toy | 340/347 DD |
| 3,716,851 | 2/1973 | Neumann | 340/347 DD |
| 3,860,908 | 1/1975 | Stratton | 340/347 DD |

*Primary Examiner*—Charles D. Miller
*Attorney, Agent, or Firm*—J. T. Cavender; Edward Dugas; Arthur A. Sapelli

[57] ABSTRACT

An electrically configurable decoder including selectively configurable combinations of a plurality of basic decode circuits. The electrically configurable decoder includes a plurality of mode selection inputs, a plurality of address inputs, a plurality of logic level definition inputs, and a plurality of disable inputs. Various combinations of decoding functions are provided by the electrically configurable decoder in response to the mode selection inputs. A plurality of selection circuits selectively decodes various ones of the address inputs and mode selection inputs to produce signals which are applied to decode inputs and enable inputs of the basic decoder circuits. A logical "one" applied to a first one of the logic level definition inputs causes "high" and "low" voltage levels produced at the outputs of a first one of the basic decoder circuits to represent logical "ones" and "zeroes," respectively. A disable signal applied to one of the disable inputs of the electrically configurable decoder causes the outputs of the first basic decoder circuits to assume logical "zero" levels as determined by the first logic level definition input.

16 Claims, 5 Drawing Figures

ELECTRICALLY CONFIGURABLE HIGH-LOW DECODER

BACKGROUND OF THE INVENTION

1. Field of the Invention

The invention relates to integrated circuit decoders, and more particularly, to large scale integrated (LSI) circuit decoders which are configurable into different operating combinations and modes by means of applied control inputs.

2. Description of the Prior Art

As the state of the semiconductor art has advanced, the level of complexity of digital LSI circuits has greatly increased, and the cost per logic functions has concurrently decreased sharply. This has resulted in substantial economies to computer manufacturers. First, the initial cost of the LSI circuits has decreased. Second, the greatly increased level of functional complexity of LSI circuits has greatly reduced the number of integrated circuit packages which need to be interconnected, thereby increasing the reliability of the system and reducing costs of printed circuit boards on which the integrated circuit packages are mounted.

Although certain sections of a typical computer, such as the main memory, the arithmetic and logic unit, and the firmware memory may be implemented utilizing commercially available "standard" LSI circuits such as random access memory circuits, read only memories, and arithmetic circuits, other sections (which are referred to herein as "random logic sections") of computers are not readily implementable with such standard parts. The random logic sections include various interconnections of logic circuits which are peculiar to a particular computer design. For the random logic sections of a computer, it may be difficult for computer designers to take full advantage of the potential economies generally associated with standard LSI circuits (which are produced in great volumes and consequently have low cost per function). This is because the random logic sections must usually be implemented by "custom designed" LSI circuits or by medium scale integrated (MSI) circuits having much lower functional density per semiconductor chip. High engineering costs are ordinarily incurred in the development of custom designed LSI circuits; consequently, the relatively low volumes of custom designed LSI circuits used for a particular computer prevent the economies usually associated with LSI circuits from being realized for the random logic section of a computer. Thus, there is a great need to reduce the number of different types of LSI circuits which must be utilized in implementing the random logic portion of a digital computer so that the potential economies of large scale integrated circuit technology can be exploited for the random logic section of a computer.

Decoding circuits of various types are utilized in large numbers in a typical computer. However, such decoding circuits perform a wide variety of specialized functions. Therefore, use of standard LSI circuits for such decoding circuits is impractical, since a large number of specialized custom designed LSI decoding circuits would be required. The production volumes for each custom designed decoding circuit would be very low, and the cost per decoding function would be very high because of the high engineering costs associated with development of each different custom designed LSI decoding circuit.

When a decoding function requiring a large number of input variables and a large number of outputs is required, a number of "smaller" decoders (wherein each of the smaller decoders has fewer inputs and fewer outputs than the subject decoding function) are ordinarily utilized. Interconnection of such "smaller" decoders to obtain "larger" decoders ordinarily involves use of additional logic gates. This results in addition of "gate delays" (associated with such additional logic gates) to the total decoder delay, thereby reducing speed of operation of the "larger" decoder. There is clearly a need for new techniques and new circuits to permit the computer designer to provide circuits which produce the various decoding function required in a typical computer and still achieve the economies typically achievable by use of high volume LSI circuits.

SUMMARY OF THE INVENTION

Accordingly, it is an object of the invention to provide a selectively configurable large scale integrated circuit by application of a mode selection signal thereto.

It is another object of the invention to provide a decoding circuit which is selectively configurable by application of a mode selection signal thereto.

It is yet another object of the invention to provide a large scale integrated circuit which is selectively configurable into a plurality of configurations utilized in a single computer by application of a mode selection signal.

It is another object of the invention to provide a decoding circuit which has outputs whereon a logic level associated with a particular voltage level is determined by a logic level definition input signal applied to the decoding circuit.

It is another object of the invention to provide a decoding circuit having first and second selectable modes wherein the decoding circuit may be selected to operate in the first mode, the decoding circuit having address inputs coupled in parallel with address inputs of another similar decoder selected to operate in the second mode to provide an expanded decoding function without the utilization of additional logic gates.

Briefly described, and in accordance with one embodiment thereof, the invention provides an electrically configurable decoding circuit including at least one mode selection input, a plurality of address inputs, a plurality of selection circuits and a plurality of basic decoding circuits, each of the basic decoding circuits having an enable input, a plurality of decode inputs, and a plurality of outputs. The selection circuits operate to decode various ones of the address inputs and mode selection inputs of the electrically configurable decoding circuit to produce enable signals. The enable signals are applied to the decode inputs of the basic decoding circuits, thereby electrically configuring the plurality of basic decoder circuits into operative combinations which form one or more independent decoding circuits.

In one embodiment of the invention, the basic decoding circuits are 2-to-4 decoders. The electrically configurable decoding circuit includes six basic decoding circuits which may be selectively configured in response to two mode selection inputs to provide three independent 3-to-8 decoders, or one 4-to-16 decoder and one independent 3-to-8 decoder, or one 5-to-24 decoder which decodes the first twenty-four binary combinations of the five inputs thereof, or one 5-to-24 decoder which decodes the ninth through the thirty-second binary combinations of the five inputs thereof.

In another embodiment of the invention, circuitry responsive to a logic level definition input signal causes "high" and "low" output voltage signals produced by a first one of the basic decoding circuits to represent logical "ones" and "zeroes," respectively if the logic level definition input signal is a logical "one." However, if the logic level definition input is a logical "zero," then the same "high" and "low" output voltages are caused to represent a logical "zero" and a logical "one," respectively. A disable signal applied to the electrically configurable decoding circuit activates a disable circuit which causes the outputs of the first basic decoding circuit to assume a logical "zero" state as it is determined by the logic level definition input.

Another embodiment of the invention includes additional address inputs which operate as chip enable inputs when certain modes of operation of the electrically configurable decoding circuit are selected. This feature permits coupling a plurality of the electrically configurable decoding circuits in parallel to provide a larger decoder without use of additional logic gates, which add a delay time to the total decoding time.

DESCRIPTION OF THE INVENTION

Figure 1:
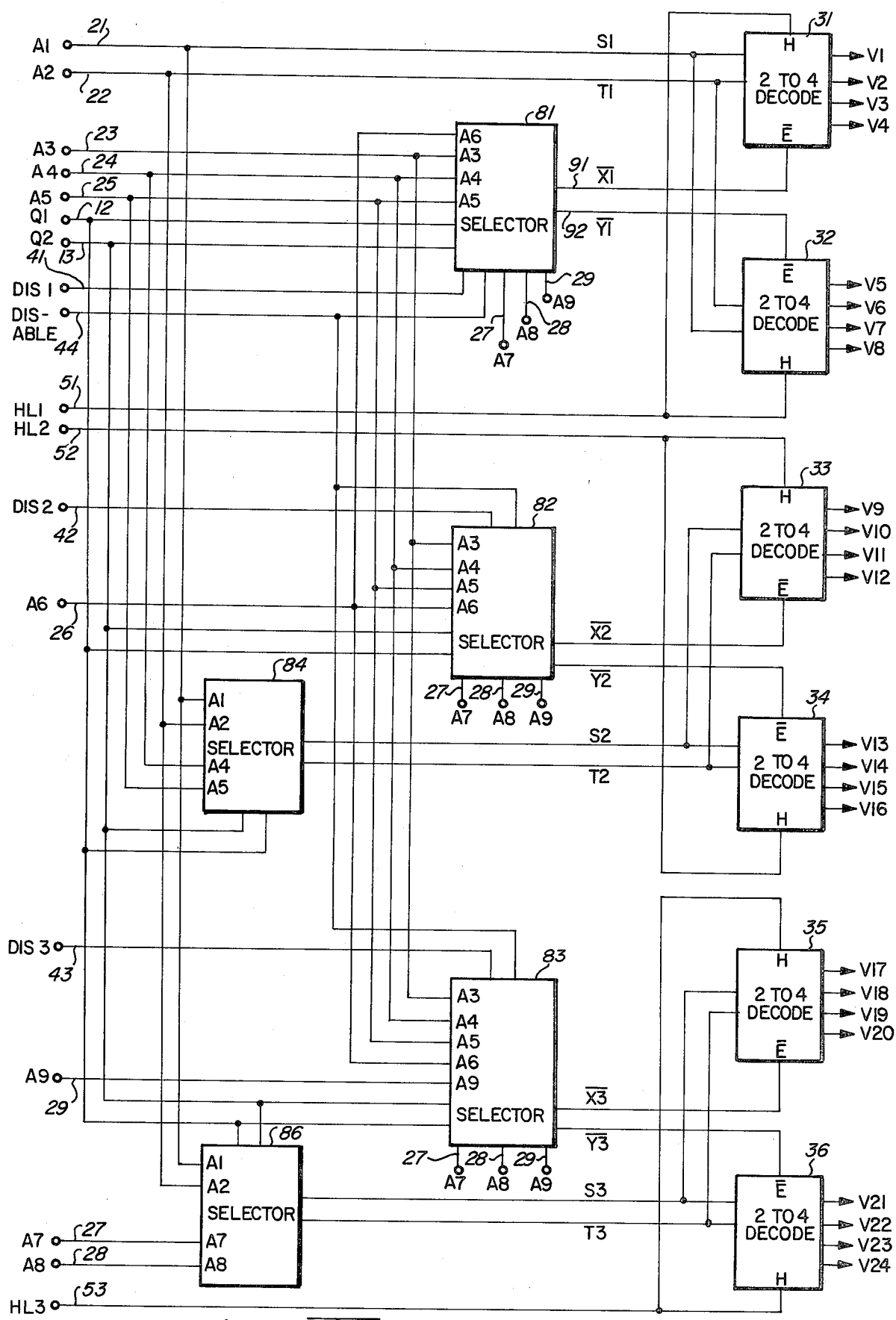
FIG. 1 shows a detailed block diagram of an electrically configurable decoder.

Referring to the drawings, and particularly to FIG. 1, electrically configurable decoder 10 is disposed in a semiconductor chip. Electrically configurable decoder 10, also referred to as decoder 10, is capable of being selectively electrically altered to provide four independent decoding configurations of the six 2-to-4 basic decoders 31, 32 ... 36 (hereinafter referred to simply as decoders) corresponding to the four possible configurations of mode selection input variables Q1 and Q2. Q1 and Q2 are applied to mode selection inputs 12 and 13, respectively. The first configuration, referred to herein as "Mode 1," causes decoder 10 to perform the functions of three independent 3-to-8 basic decoders. (A 3-to-8 decoder is one which has three "decode" inputs and eight outputs; it decodes each of the possible binary configurations of the three "decode" inputs to produce output selection signals on the eight respective outputs. Decoders having different numbers of "decode" inputs and outputs are defined and operate similarly.)

The Mode 1 configuration is established when Q1 and Q2 are both logical "zeroes." The second configuration, referred to as "Mode 2," causes decoder 10 to operate as two independent decoders, one being a 4-to-16 decoder and the other being a 3-to-8 decoder. The Mode 2 configuration is established when Q1 is a logical "one" and Q2 is a logical "zero." The third configuration, referred to as Mode 3, occurs when Q1 is a logical "zero" and Q2 is a logical "one", and causes decoder 10 to operate as a 5-to-24 decoder which decodes the first twenty-four binary combinations of the five input variables. (For the described embodiment of the invention, the number of outputs is limited to twenty-four because of the unavailability of a suitable package having more available pins which could be used as outputs.) The fourth configuration, referred to as "Mode 4," which corresponds to Q1 and Q2 both being logical "ones," causes decoder 10 to appear as a 5-to-24 decoder decodes the ninth through the thirty-second binary combinations of the five input variables.

Electrically configurable decoder 10 includes nine address inputs 21, 22, ... 29 with which nine address variables A1–A9 are respectively associated. The address variables, often referred to simply as address inputs, are decoded by decoder 10 to produce output signals V1, V2 ... V24.

Electrically configurable decoder 10 has three additional logic inputs HL1, HL2, and HL3 applied to inputs 51, 52 and 53, respectively, which are referred to as "high-low" inputs, or as logic level definition inputs. Each of the 2-to-4 decoders of FIG. 1 has an "H" input, which will be explained in detail hereinafter with reference to FIG. 3. High-low input 51 is connected to the "H" inputs of 2-to-4 decoders 31 and 32, high-low input 52 is connected to the "H" inputs of 2-to-4 decoders 33 and 34, and high-low input 53 is connected to the "H" inputs of 2-to-4 decoders 35 and 36.

HL1, HL2, and HL3 are utilized to define the logic levels with respect to the voltage levels at the decoder outputs V1–V24, as follows. If HL1 is a logical "zero," then "high" and "low" voltages on outputs V1–V8 are caused to be logical "zeroes" and logical "ones," respectively. The logical "one" and "zero" levels on outputs V9–V16 are similarly determined by HL2, and the logical "one" and "zero" levels on outputs V17–V24 are similarly determined by HL3.

Electrically configurable decoder 10 further includes three "disable" inputs, designated DIS1, DIS2, and DIS3, applied to inputs 41, 42, and 43, respectively. When DIS1 is a logical "one," the outputs V1–V8 of 2-to-4 decoders 31 and 32 are all forced to logical "zeroes," as determined by HL1. Similarly, when DIS2 is a logical "one," the outputs of 2-to-4 decoders 33 and 34 are forced to logical "zeroes," and when DIS3 is a logical "one," the output of 2-to-4 decoders 35 and 36 are forced to logical "zeroes," as determined by HL2 and HL3, respectively. Another disable logical input variable, designated DISABLE, is applied to input 44 and causes the outputs of all six of the 2-to-4 decoders of FIG. 1 to assume logical "zeroes."

Each of the 2-to-4 decoders of FIG. 1 each has an "enable" input, designated by "$\overline{E}$." The 2-to-4 decoders are "selected" by means of selector circuits 81, 82, and 83, which produce enable signals $\overline{X1}$, $\overline{Y1}$, $\overline{X2}$, $\overline{Y2}$, $\overline{X3}$, and $\overline{Y3}$ which are applied to the "$\overline{E}$" inputs of 2-to-4 decoders 31, 32, ... 36, respectively, in response to the combinations of Q1, Q2, and A1–A9 set forth in Table 1.

TABLE 1

| Mode | Q2 | Q1 | $\overline{X3}$ | $\overline{Y3}$ | $\overline{X2}$ | $\overline{Y2}$ | $\overline{X1}$ | $\overline{Y1}$ |
|---|---|---|---|---|---|---|---|---|
| 1 | 0 | 0 | A9 | $\overline{A9}$ | A6 | $\overline{A6}$ | A3 | $\overline{A3}$ |

TABLE 1-continued

| Mode | Q2 | Q1 | $\overline{X3}$ | $\overline{Y3}$ | $\overline{X2}$ | $\overline{Y2}$ | $\overline{X1}$ | $\overline{Y1}$ |
|---|---|---|---|---|---|---|---|---|
| 2 | 0 | 1 | A9 | $\overline{A9}$ | $\overline{A4} + A3$ | $\overline{A4} + \overline{A3}$ | A4 + A3 | A4 + $\overline{A3}$ |
| 3 | 1 | 0 | $\overline{A5} + A4 + A3$ | $\overline{A5} + A4 + \overline{A3}$ | A5 + $\overline{A4}$ + A3 | A5 + $\overline{A4}$ + $\overline{A3}$ | A5 + A4 + A3 | A5 + A4 + $\overline{A3}$ |
| 4 | 1 | 1 | A5 + A4 + A3 | A5 + A4 + A3 | A5 + A4 + A3 | A5 + A4 + A3 | A5 + A4 + A3 | A5 + A4 + A3 |

The outputs of each of the six 2-to-4 decoders are selected by various combinations of signals designated as inputs S1, T1, S2, T2, S3, and T3 in FIG. 1. These signals are produced by A1, A2 and selector circuits 84 and 85 in response to various combinations of the address inputs A1–A9 and mode selection inputs Q1 and Q2 as set forth in Table 2.

TABLE 2

| Mode | Q2 | Q1 | S3 | T3 | S2 | T2 | S1 | T1 |
|---|---|---|---|---|---|---|---|---|
| 1 | 0 | 0 | A7 | A8 | A4 | A5 | A1 | A2 |
| 2 | 0 | 1 | A7 | A8 | A1 | A2 | A1 | A2 |
| 3 | 1 | 0 | A1 | A2 | A1 | A2 | A1 | A2 |
| 4 | 1 | 1 | A1 | A2 | A1 | A2 | A1 | A2 |

Figure 2:
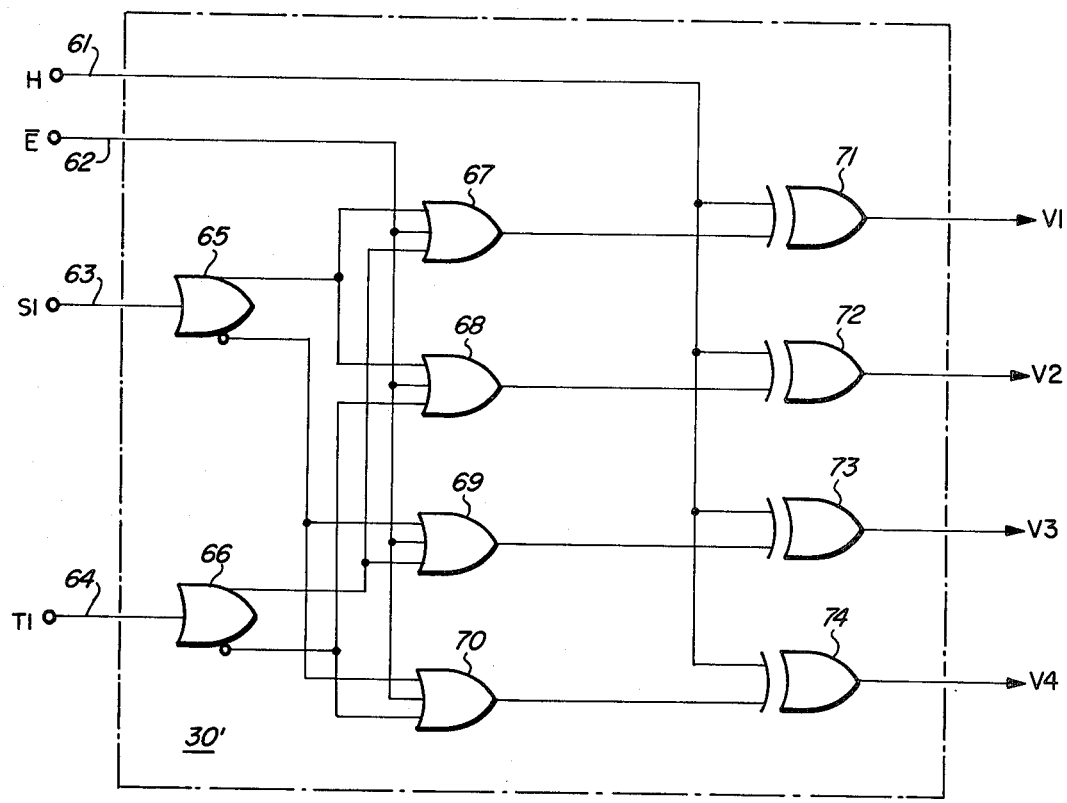
FIG. 2 shows a logic diagram of one of the 2-to-4 basic decoders of FIG. 1.

Before explaining the operation of decoder 10 of FIG. 1, it will be helpful to describe the detailed structure and operation of one of the 2-to-4 decoders, which may all be implemented by the same or similar circuitry. A detailed logic diagram of 2-to-4 decoder 31 is shown in FIG. 2, wherein 2-to-4 decoder 30' includes inputs 61, 62, 63, and 64. Input 61 is the "H" or "high-low" input. Input 62 is the "E" or "enable" input, to which the enable signal $\overline{X1}$ produced by selector circuit 81 is applied, as shown in FIG. 1. "Decode" signals S1 and T1 are applied to inputs 63 and 64, respectively.

Still referring to FIG. 2, inverters 65 and 66 each produce both inverting and non-inverting signals which are decoded by OR gates 67, 68, 69, and 70. These OR gates perform a logical ANDing function with respect to "negative logic" variables at their inputs. ("Negative logic" variables are logic variable for which "low" and "high" voltages represent logical "one" and logical "zero" levels, respectively; "positive logic" variables are oppositely defined. The logic levels described herein are assumed to be positive logic levels unless otherwise stated.) If enable input 62 is at a "low" voltage level, i.e., a logical "zero," decode inputs S1 and T1 cause "selection" of one of the four OR gates, 67, 68, 69, or 70.

Exclusive OR circuits 71, 72, 73, and 74 each have an input connected to "high-low" input 61 and another input connected to a respective one of the outputs of OR gates 67, 68, 69, and 70. Thus, if "high-low" input 61 (also referred to as "logic level definition input 61") is at a logical "one," and if disable signal DIS1 is applied to selection circuit 81, thereby causing "E" input 62 to be at a logical "one," (as subsequently explained), a logical "one" appears at the outputs of OR gates 67–70, causing "matches" at the inputs of each of exclusive OR circuits 71–74. This causes the outputs of each of exclusive OR gates 71–74 to assume a "low" voltage, which is defined as a logical "zero" when "high-low" input 61 is a logical "one" (as described previously). However, if "high-low" input 61 is at a "low" voltage level (i.e., a logical "zero") a "mismatch" appears at the inputs of each of exclusive OR gates 71–74, causing the outputs of each of the exclusive OR gates to assume a "high" voltage level, which is then defined as a logical "zero."

It should be noted that the inverters, OR gates, and exclusive OR gates of FIG. 2 may be readily implemented by using emitter coupled logic (ECL) circuits, which are very well known to those skilled in the art. It should be noted that exclusive OR gates 71 could be exclusive NOR gates; this merely reverses the logic level definitions. Both exclusive OR gates and exclusive NOR gates are considered to perform what is referred to herein as an "exclusive ORing" function.

Thus, it is seen that the disable inputs DIS1, DIS2, DIS3, and DISABLE operate to cause the outputs of the various 2-to-4 decoders to assume logical "zeroes" in accordance with the logic levels applied at the "high-low" inputs HL1, HL2, and HL3.

Referring again to FIG. 1, selector circuit 81 decodes address inputs 23, 24 and 25 and mode control inputs Q1 and Q2 to produce enable signals $\overline{X1}$ and $\overline{Y1}$, which select (i.e., enable) or deselect 2-to-4 decoders 31 and 32, respectively. (The decode inputs S1 and T1 select one of the four outputs of whichever one of 2-to-4 decoders 31 and 32 happens to be selected.) As previously mentioned, the functions performed by selector 81 are shown by the truth table of Table 1. The logic circuit of FIG. 3 indicates a way of implementing the functions of selector circuit 81.

Selector circuit 81 generates enable signals $\overline{X1}$ and $\overline{Y1}$ which are applied to the enable inputs of 2-to-4 decoders 31 and 32, respectively. The disable signals DIS1 applied to conductor 41 and DISABLE applied to conductor 44 are also inputted to selector circuit 81 to cause enable signals $\overline{X1}$ and $\overline{Y1}$ to assume logical "one" levels. Similarly, selector circuit 82 produces enable signals $\overline{X2}$ and $\overline{Y2}$ in response to Q1, Q2, A3, A4, A5, A6, DIS2, and DISABLE. $\overline{X2}$ and $\overline{Y2}$ enable 2-to-4 decoders 33 and 34, respectively. Similarly, selector circuit 83 produces enable signals $\overline{X3}$ and $\overline{Y3}$, which are respectively coupled to the enable inputs of 2-to-4 decoders 35 and 36, in response to Q1, Q2, A3, A4, A5, A6, A9, DIS3, and DISABLE. Selector circuit 84 produces "decode" signals S2 and T2 to the decode inputs of 2-to-4 decoders 33 and 34 in response to Q1, Q2, A1, A2, A4, and A5; similarly, selector circuit 86 produces decode signals S3 and T3 in response to Q1, Q2, A1, A2, A7, and A8.

An additional function performed by electrically configurable decoder 10 permits decoder 10 to be entirely disabled if decoder 10 is in either Mode 3 or Mode 4 and A9 or A8 are logical "ones" or if A7 or A6 are logical "zeroes." This function is accomplished by providing A6, A7, A8, and A9 as inputs to selectors 81, 82, and 83 to produce logical "ones" on all of enable signals $\overline{X1}$, $\overline{Y1}$, $\overline{X2}$, $\overline{Y2}$, $\overline{X3}$, and $\overline{Y3}$ when any of the above conditions are met. The circuitry which accomplishes this for $\overline{X1}$ and $\overline{Y1}$ is shown for selector 81' in FIG. 3; similar circuitry accomplishes similar functions in selectors 82 and 83.

Figure 3:
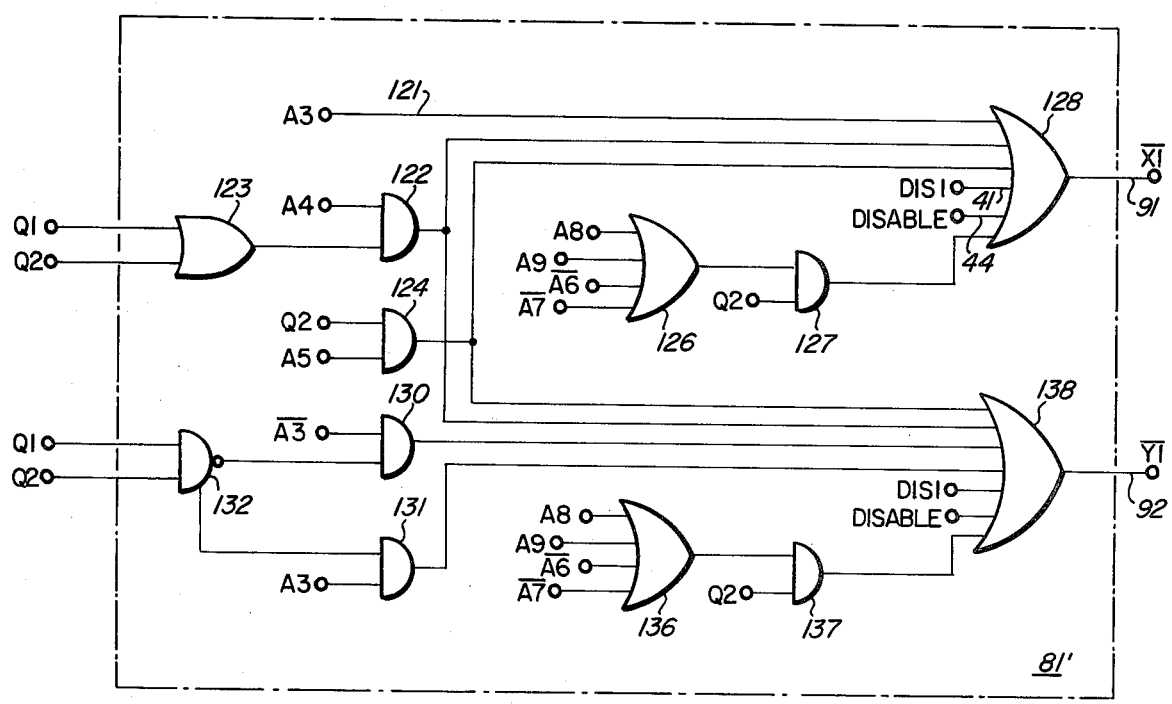
FIG. 3 shows a logic diagram of one of the selector circuits of FIG. 1.

Before further explanation of decoder 10 is presented, the detailed structure of one of the selector circuits will be set forth. Referring to FIG. 3, selector circuit 81' includes all of the circuitry of selector circuit 81 in FIG. 1 except inverters necessary to produce the logical complement signals used as inputs to various ones of the logic gates shown in FIG. 3. (It should be noted that the complement signals $\overline{A6}$, $\overline{A7}$, $\overline{A8}$, and $\overline{A9}$, as well as all other complement signals or "barred" signals shown in the drawings and referred to herein, can be readily derived using well known logic circuits, which circuits are not shown or described in the present drawing and description for purposes of simplicity.) Selector circuit 81' includes conductor 121, to which A3 is applied; A3 is thereby applied to one input of OR gate 128. Q1 is applied to one input of OR gate 123 and Q2 is applied to another input thereof. AND gate 122 decodes A4 and the output of OR gate 123 to produce an output signal which is applied to another input of OR gate 128. AND gate 124 has Q2 applied to one of its inputs and has A5 applied to its other input. AND gate 124 produces an output signal which is applied to another input of OR gate 128. AND gates 122 and 124 and OR gate 123 cooperate with OR gate 128 to produce $\overline{X1}$, as set forth in the truth table of Table 1. The output of OR gate 128 is connected to conductor 91, whereon enable output $\overline{X1}$ is produced.

The above-mentioned disable signals DIS1 and DISABLE (on conductors 41 and 44, respectively) are applied as additional inputs to OR gate 128. A logical "one" applied to either of the DIS1 or DISABLE inputs causes $\overline{X1}$ to assume a logical "one" level on conductor 91, thereby disabling the 2-to-4 decoder 31, as described previously. The "disabling" operation of address inputs A6, A7, A8, and A9 in Mode 3 and Mode 4 (described above) is accomplished by means of OR gate 126, which has $\overline{A6}$, $\overline{A7}$, A8, and A9 applied as inputs thereto. The output of OR gate 126 is connected to one input of AND gate 127, which is enabled by Q2. The output of AND gate 127 is provided as another input to OR gate 128. Consequently, during modes 3 and 4, (when Q2 is a logical "one"), if A8 or A9 equals logical "one," or if A6 or A7 equals a logical "zero," the output of AND gate 127 then assumes a logical "one" level, which causes $\overline{X1}$ to assume a logical "one" level, thereby disabling 2-to-4 decoder 31.

The cooperation between OR gate 138 and the remaining logic gates in FIG. 3 coupled to the inputs of OR gate 138 to produce enable signal $\overline{Y1}$ on conductor 92 is entirely similar to that between the above-described logic gates. One skilled in the art may readily verify that AND gates 122, 124, 130, 131 and 132 and OR gate 123 cooperate to decode logic variables Q1, Q2, A3, A4, and A5 to implement the functions set forth for $\overline{Y1}$ in Table 1.

The circuitry for selector circuits 82, 83, 84, and 86 is somewhat different than that of selector circuit 81. However, the above-described "disable" (or "enable") functions involving A6, A7, A8, and A9 and the disable functions associated with DIS2, DIS3, and DISABLE are implemented similarly for selector circuits 82 and 83 as for selector circuit 81. The circuitry for selector circuits 82, 83, 84, and 86 implement the remaining functions set forth in Tables 1 and 2 to produce $\overline{X2}$, $\overline{Y2}$, $\overline{X3}$, $\overline{Y3}$, S2, T2, S3, and T3 may be readily provided by those skilled in the art, and consequently is not set forth in further detail herein. The logic circuitry shown in FIG. 3 and variations thereof may also be readily implemented using ECL (emitter coupled logic) circuitry.

Figure 4:
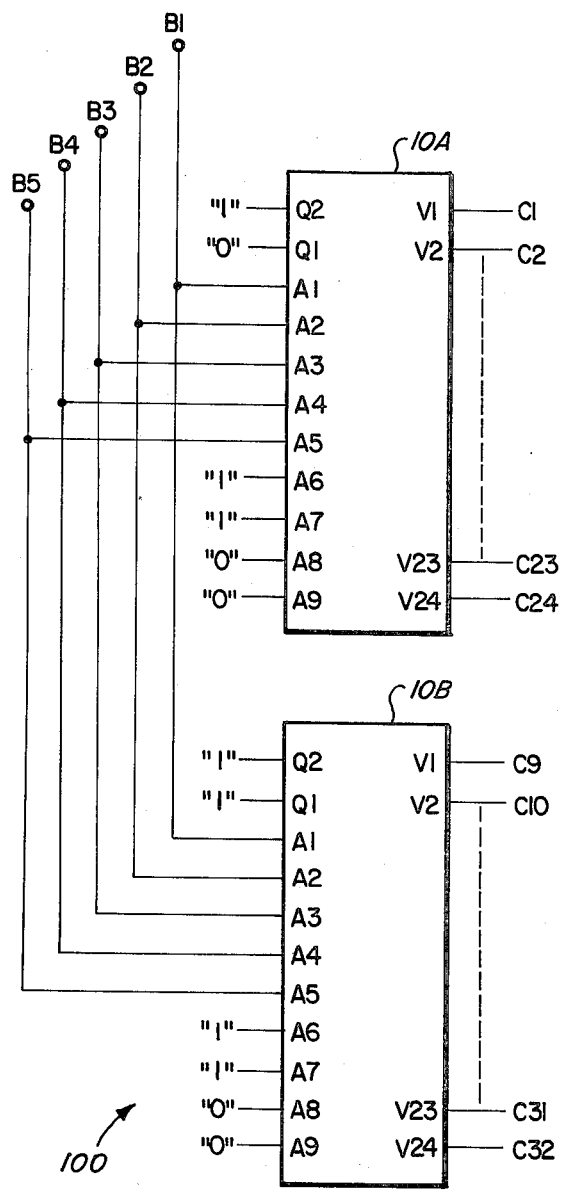
FIG. 4 illustrates the connection of two of the electrically configurable decoders of FIG. 1 to provide a 5-to-32 decoder.
Figure 5:
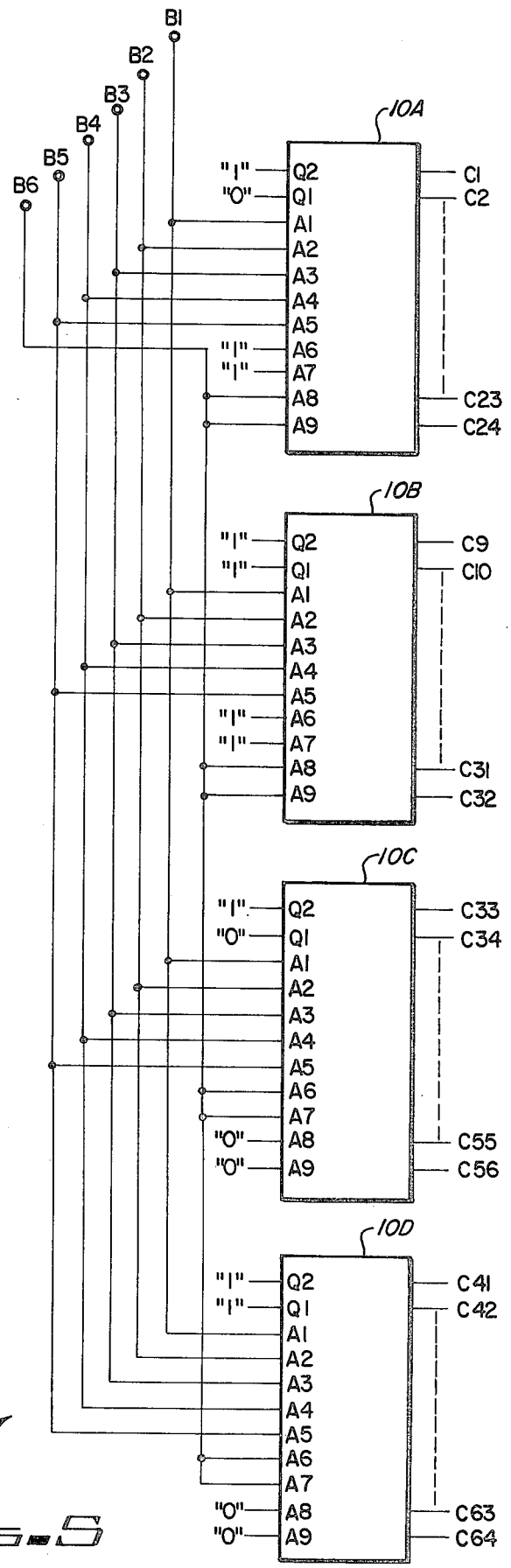
FIG. 5 illustrates the connection of four of the electrically configurable decoders of FIG. 1 to provide a 6-to-64 decoder.

As previously mentioned, when electrically configurable decoder 10 is selected to be operating in either Mode 3 (Q1=0 and Q2=1) or Mode 4 (Q1=1 and Q2=1), the entire electrically configurable decoder 10 is disabled if either A7 or A6 equals a logical "zero" or if either A8 or A9 equals a logical "one." This characteristic permits convenient "expansion" of decoder 10 to provide larger decoders (i.e., more inputs and more outputs) without use of additional external gates. This is highly desirable, because the additional logic gates not only add the cost of the gates themselves, but also increase the required space and number of conductors on the printed circuit boards used in the system. Further, the time required to perform a decoding operation is increased, due to the additional propagation delay associated with such additional logic gates. FIGS. 4 and 5 show how electrically reconfigurable decoder 10 may be "expanded" to provide a 5-to-32 decoder and a 6-to-64 decoder without the use of any additional logic gates.

Referring to FIG. 4, two electrically configurable decoders 10A and 10B identical or similar to decoder 10 of FIG. 1 are connected to form a 5-to-32 decoder 100. Decoder 100 has five decode inpts B1, B2 . . . B5 and thirty-two outputs C1, C2 . . . C31, and C32. Electrically configurable decoder 10A has its mode selection inputs Q2 and Q1 connected, respectively, to a logical "one" voltage level and a logical "zero" voltage level, thereby causing electrically configurable decoder 10A to operate in Mode 3, as defined in Tables 1 and 2. The Q2 and Q1 mode selection inputs of electrically configurable decoder 10B are both connected to logical "one" voltage levels, thereby causing electrically configurable decoder 10B to operate in Mode 4. A6 and A7 of both of electrically configurable decoders 10A and 10B are connected to logical "one" voltage levels; also A8 and A9 of both 10A and 10B are connected to logical "zero" voltage levels, thereby causing both of electrically configurable decoders 10A and 10B to be "enabled."

At this point, it should again be noted that the selector circuits (81, 82, 83, 84, and 86 of FIG. 1) are designed so that in Mode 3, the decoder 10A decodes its address inputs A1–A5 to produce output signals corresponding to the first twenty-four combinations of its address inputs A1–A5 at its respective outputs V1, V2 . . . V23, V24 which correspond to outpts C1–C24 of 5-to-24 decoder 100 of FIG. 4. Moreover, the selector circuits of decoder 10B further operate such that in Mode 4, the ninth through the thirty-second combinations of its address input variables A1–A5 are decoded to produce signals corresponding to the ninth through the thirty-second binary combinations of A1–A5 at its outputs V1–V24, which correspond to outputs C9–C32 of 5-to-32 decoder 100. Outputs C9–C24 are duplicated in the 5-to-32 decodeer 100; however, this presents no difficulty, since the duplicated C9–C24 latter outputs may either by bussed together, or some of the duplicated outputs may be ignored, or, they may be utilized to reduce "fan-out" where multiple gates need to be driven.

Further expansion of electrically configurable decoders is shown in FIG. 5, wherein 6-to-64 decoder 110 includes four electrically configurable decoders 10A, 10B, 10C and 10D. The Q1 and Q2 mode selection inputs of electrically configurable decoders 10A and 10C are connected to logical "zero" and logical "one" voltage levels, respectively, to establish operation of decoders 10A and 10C in Mode 3. The Q2 and Q1 mode selection inputs of electrically configurable decoders 10B and 10D are connected to logical "one" voltage levels to establish Mode 4 operation. Six inputs, B1–B6, are decoded by decoder 110 to select one of sixty-four outputs C1–C64 thereof. Inputs B1–B5 are connected to inputs A1–A5 of all four of electrically configurable decoders 10A, 10B, 10C, and 10D. B6 is connected to the A8 and A9 address inputs of electrically configurable decoders 10A and 10B and to address inputs A6 and A7 of electrically configurable decoders 10C and 10D. A6 and A7 of decoders 10A and 10B are connected to logical "one" voltage levels to insure that decoders 10A and 10B are both enabled; similarly, A8 and A9 of decoders 10C and 10D are connected to logical "zero" voltages to insure that they are both enabled. Consequently, inputs B1-B5 select one out of thirty-two outputs of the combination including decoders 10A and 10B and also select one out of thirty-two outputs of the combination including decoders 10C and 10D. For the first thirty-two combinations of inputs B1-B6, B6 is at a logical "zero" level, thereby causing both of decoders 10C and 10D to be unselected and also causing both of decoders 10A and 10B to be selected. For the second thirty-two combinations of B1-B6, B6 is at a logical "one" level, thereby causing decoders 10A and 10B to be unselected and also causing both of decoders 10C and 10D to be selected. Thus, a 6-to-64 is obtained without use of any external logic gates, which would add additional delay into the decoding time.

It may readily be seen that a 7-to-128 decoder and an 8-to-256 decoder may be readily obtained by utilization of eight and sixteen of the electrically reconfigurable decoders of FIG. 1.

Those skilled in the art will readily recognize that the logic circuitry utilized to implement the selector circuits and the 2-to-4 decoder circuits shown in FIGS. 2 and 3 may be varied, since there are numerous different ways of implementing logic circuitry to accomplish the functions specified in Tables 1 and 2. For example, if NOR and AND gates are utilized, analogous but somewhat different configurations of interconnections will be required. The basic operation of the electrically configurable decoder of the invention and its many advantages will nevertheless be preserved.

Thus, the electrically configurable decoder of the invention is seen to be capable of producing considerable number of different independent decoding functions that may be required in a computing device utilizing only one type of decoding circuit which may be manufactured in large quantities and thereby may be marketed at a low cost per unit. The inefficiencies associated with utilizing different types of LSI circuits for each of the many decoding functions that may be required in a computing device are avoided, and the high cost per unit generally associated with specialized LSI parts, which are manufactured in low volumes, are also avoided.

The flexibility of the electrically configurable (and reconfigurable) decoder of the invention is due not only to its electrically configurable characteristics, but also is due to the flexible control features including the logic level definition inputs and associated circuitry, which permit definition of either "positive logic" or "negative logic" at the outputs and which also permit corresponding disabling of outputs to logical "zero" states defined by the logic level definition inputs. This flexibility in some cases may allow the user to eliminate additional logic gates which would be otherwise required.

While the invention has been described with reference to a particular embodiment thereof, variations in arrangement of parts and in operation thereof are includable within the scope and spirit of the invention as set forth in the specification, drawings, and the appended claims.

We claim:
1. A selectively configurable decoder having at least a mode selection input, a plurality of address inputs, and a plurality of outputs, said selectively configurable decoder comprising in combination:
  (a) a plurality of decoding means each having a plurality of decode inputs for decoding selectable combinations of signals applied to said decode inputs, each of said decoding means having an enable input and a plurality of outputs coupled to respective ones of said outputs of said selectively configurable decoder;
  (b) first means responsive to said address inputs and said mode selection input for producing said selectable combinations of signals; and
  (c) second means responsive to said mode selection input and said address inputs and coupled to said enable inputs of said plurality of decoding means for enabling a plurality of combinations of said plurality of decoding means in response to a plurality of combinations of binary logic levels applied to said mode selection input.

2. The selectively configurable decoder of claim 1 having two mode selection inputs, wherein said second means is responsive to both of said mode selection inputs for enabling four combinations of said plurality of decoding means in response to the four possible combinations of said two mode selection inputs.

3. The selectively configurable decoder of claim 1 wherein each one of said outputs of one of said decoding means is selected in response to a different combination of said decode inputs of said one of said decoding means when a logical "zero" is applied to said enable input of said one of said decoding means.

4. The selectively configurable decoder of claim 2 wherein said selectively configurable decoder has a control input for defining output logic levels of one of said decoding means with respect to output voltage levels thereof, wherein said one of said decoding means has an input coupled to said control input for controlling whether a high voltage output signal or a low voltage output signal is a logical "zero."

5. The selectively configurable decoder of claim 1 wherein said selectively configurable decoder has a disable input, and wherein said second means includes third means responsive to said disable input for producing a signal on the enable input of one of said decoding means to produce a logical "zero" on all of the outputs of said one of said decoding means when a logical "one" is applied to said disable input.

6. The selectively configurable decoder of claim 4 wherein said selectively configurable decoder has a disable input, and wherein said second means includes third means responsive to said disable input for producing a signal on the enable input of one of said decoding means to produce a logical "zero" on all of the outputs of said one of said decoding means when a logical "one" is applied to said disable input.

7. The selectively configurable decoder of claim 6 wherein each of said decoding means are 2-to-4 decoders.

8. The selectively configurable decoder of claim 1 further including means responsive to one of said address inputs for enabling or disabling said selectively configurable decoder in response to a signal applied to said one of said address inputs, thereby permitting coupling of said selectively configurable decoder to another selectively configurable decoder to produce a decoder capable of decoding more combinations of address inputs than either of said selectively configurable decoders alone.

9. The selectively configurable decoder of claim 1 wherein said second means decodes a first plurality of combinations of said address inputs to produce output signals representative of respective ones of said first plurality of combinations on respective ones of said outputs of said selectively configurable decoder in response to said first logic level and wherein said second means further decodes a second plurality of combinations of said address inputs to produce output signals representative of respective ones of said second plurality of combinations of said respective ones of said outputs of said selectively configurable decoder in response to said second logic level.

10. The selectively configurable decoder of claim 7 including a second mode selection input and six of said 2-to-4 decoders, wherein said second means selectively configures said six 2-to-4 decoders to operate as three pairs of 3-to-8 decoders in response to one combination of said first and second mode selection inputs, and as a 4-to-16 decoder and a 3-to-8 decoder in response to a second combination of said first and second mode control inputs, and as a 5-to-24 decoder in response to a third and fourth combination of said first and second mode selection inputs.

11. The selectively configurable decoder of claim 10 including nine of said address inputs, wherein said second means includes three selection circuits responsive to said two mode selection inputs and various ones of said address inputs, each of said selection circuits applying enable signals, respectively, to two of said decoding circuits.

12. The selectively configurable decoder of claim 10 wherein said second means is responsive to four of said nine address inputs to disable the entire selectively configurable decoder for two of the four possible combinations of said two mode selection inputs 13. The selectively configurable decoder of claim 6 wherein one of said decoding means includes a plurality of logic gates responsive to the decode inputs of said one of said decoding means and to the enable input of said one of said decoding means and further includes exclusive OR means responsive to said control input and to said outputs of said plurality of logic gates for producing output signals on said outputs in accordance with matches or mismatches between said control signal and the outputs of said plurality of logic gates, thereby accomplishing said defining of said output logic levels.

14. The selectively configurable decoder of claim 9 wherein said first plurality of combinations includes the first twenty-four binary combinations of said address inputs, and wherein said second plurality of combinations includes the ninth through the thirty-second combinations of said address inputs.

15. The selectively configurable decoder of claim 9 wherein said first and second combinations of address inputs are overlapping binary combinations of address inputs.

16. The selectively configurable decoder of claim 15 coupled to a second selectively configurable decoder as recited in claim 9, wherein said mode selection input of said selectively configurable decoder is at said first logic level and said mode selection input of said second selectively configurable decoder is at said second logic level, and wherein a plurality of the address inputs of said selectively configurable decoder and said second selectively configurable decoder are bussed together.

* * * * *